United States Patent
Sung (10) Patent No.: US 8,670,107 B2
(45) Date of Patent: Mar. 11, 2014

(54) MASKLESS EXPOSURE APPARATUS AND CONTROL METHOD THEREOF

(75) Inventor: Jeong Hyoun Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 434 days.

(21) Appl. No.: 12/926,513

(22) Filed: Nov. 23, 2010

(65) Prior Publication Data

US 2011/0134406 A1   Jun. 9, 2011

(30) Foreign Application Priority Data

Dec. 8, 2009  (KR) .................. 10-2009-0121240

(51) Int. Cl.
*G03B 27/54* (2006.01)
*G03B 27/68* (2006.01)
*G03B 27/52* (2006.01)
*G03B 27/32* (2006.01)
*G03B 27/42* (2006.01)

(52) U.S. Cl.
USPC .................. 355/67; 355/52; 355/53; 355/55; 355/77

(58) Field of Classification Search
USPC ................ 355/46, 52, 53, 55, 67–71, 77; 250/492.1, 492.2, 492.22, 548; 356/399–401
See application file for complete search history.

(56) References Cited

U.S. PATENT DOCUMENTS

| | | | |
|---|---|---|---|
| 6,312,134 B1 * | 11/2001 | Jain et al. | 359/855 |
| 7,209,216 B2 * | 4/2007 | De Jager et al. | 355/67 |
| 2004/0008332 A1 * | 1/2004 | Nakaya et al. | 355/53 |
| 2005/0099615 A1 * | 5/2005 | Ishii | 355/67 |
| 2005/0213067 A1 * | 9/2005 | Van Der Feltz et al. | 355/67 |
| 2005/0219502 A1 * | 10/2005 | Sandstrom et al. | 355/77 |
| 2006/0176362 A1 * | 8/2006 | Penn et al. | 347/239 |
| 2006/0269217 A1 * | 11/2006 | Shirota et al. | 385/147 |
| 2007/0076180 A1 * | 4/2007 | Tinnemans et al. | 355/53 |
| 2007/0296936 A1 * | 12/2007 | Kato et al. | 355/52 |
| 2008/0059096 A1 * | 3/2008 | Stenstrom et al. | 702/85 |
| 2008/0143989 A1 * | 6/2008 | Brudermann et al. | 355/68 |
| 2009/0115981 A1 * | 5/2009 | Mushano | 355/52 |

* cited by examiner

*Primary Examiner* — Toan Ton
*Assistant Examiner* — Christina Riddle
(74) *Attorney, Agent, or Firm* — Harness, Dickey & Pierce (57) ABSTRACT

Disclosed herein is a mask-less exposure apparatus to enlarge or reduce an exposure area in a scan direction and a control method thereof. The mask-less exposure apparatus includes a light source unit configured to supply light, a spatial light modulation unit configured to selectively transmit the light to a substrate, a drive pulse generation unit configured to generate a drive pulse signal and adjust an operation beginning time of the spatial light modulation unit, a substrate shape measurement unit configured to measure a scan-direction length of the substrate, and a drive pulse correction unit configured to correct a drive pulse signal interval so as to enlarge or reduce an exposure area of the substrate according to the scan-direction length of the substrate.

15 Claims, 10 Drawing Sheets

MASKLESS EXPOSURE APPARATUS AND CONTROL METHOD THEREOF

CROSS-REFERENCE TO RELATED APPLICATION

This application claims priority under 35 U.S.C. §119 to Korean Patent Application No. 2009-0121240, filed on Dec. 8, 2009 in the Korean Intellectual Property Office, the entire disclosure of which is incorporated herein by reference.

BACKGROUND

1. Field

Example embodiments relate to a mask-less exposure apparatus to enlarge or reduce an exposure area and a control method thereof.

2. Description of the Related Art

In general, a method to form a pattern on a panel of a Flat Panel Display (FPD) is as follows. First, a panel is coated with a pattern material and then, the pattern material is selectively exposed by use of a photo-mask. As chemical properties of a part of the pattern material are changed by the selective exposure, the chemically changed part or the remaining part of the pattern material is selectively removed, completing formation of a pattern.

Presently, a mask-less exposure apparatus not using a photo-mask is been widely used. In the mask-less exposure apparatus, a light beam is transferred to a panel based on pattern information in the form of electrical signals obtained by use of an electronic unit. More specifically, differently from a conventional analog exposure apparatus using a mask, the mask-less exposure apparatus uses a new pattern exposure method using light management software, and is used in the printing of a circuit board, the manufacture of a liquid crystal display (LCD) panel, or the like. An example of the electronic unit is a Digital Micro-mirror Device (DMD). The DMD utilizes the principle of making a single screen using only a required quantity of light, in which a relatively large number of micro-mirrors guide light having a given incidence angle in a desired angular direction while guiding the remaining light in a different angular direction.

In the meantime, it may be necessary for an exposure apparatus to enlarge or reduce an exposure area and the conventional analog exposure apparatus has accomplished this function via management of an optical system. However, the digital mask-less exposure apparatus has difficulty in direct management of an optical system due to use of a plurality of heads and performs a scanning exposure operation and therefore, may need a method to enlarge or reduce an exposure area in a scan direction.

SUMMARY

According to example embodiments, a mask-less exposure apparatus includes a light source unit configured to supply light; a spatial light modulation unit configured to selectively transmit the light to a substrate; a drive pulse generation unit configured to generate a drive pulse signal and adjust an operation beginning time of the spatial light modulation unit; a substrate shape measurement unit configured to measure a scan-direction length of the substrate; and a drive pulse correction unit configured to correct a drive pulse signal interval so as to enlarge or reduce an exposure area of the substrate according to the scan-direction length of the substrate.

According to example embodiments, the mask-less exposure apparatus, further includes a position-information providing unit configured to generate an input signal having a desired period in response to a movement of the substrate in a scan direction.

According to example embodiments, the input signal includes a pulse signal; and the drive pulse generation unit generates the drive pulse signal whenever a reference number of the pulse signal is generated.

According to example embodiments, the drive pulse correction unit corrects the drive pulse signal interval by changing the reference number of the pulse signal.

According to example embodiments, the drive pulse correction unit increases the reference number to increase the drive pulse signal interval upon confirming that the scan-direction length of the substrate is increased.

According to example embodiments, the drive pulse correction unit decreases the reference number to decrease the drive pulse signal interval by confirming that the scan-direction length of the substrate is reduced.

According to example embodiments, the spatial light modulation unit includes a Digital Micro Mirror (DMD), and a plurality of spatial light modulation units are provided to perform an exposure operation on the substrate.

According to example embodiments, the drive pulse correction unit confirms whether or not a measure is adjusted by applying a scale factor to the scan-direction length of the substrate, and if the scale factor is applied to the scan-direction length of the substrate, corrects the drive pulse signal interval to perform an exposure operation corresponding to the scan-direction length of the substrate.

According to example embodiments, the substrate shape measurement unit measures the scan-direction length of the substrate by comparing distances between marks provided on four corners of the substrate.

According to example embodiments, a control method of a mask-less exposure apparatus includes confirming a scan-direction length of a substrate on a stage; adjusting an interval of a drive pulse signal applied to a spatial light modulation unit according to the scan-direction length of the substrate; and applying the drive pulse signal of the adjusted interval to the spatial light modulation unit, so as to expose an increased or decreased substrate area according to the scan-direction length of the substrate.

According to example embodiments, the confirmation of the scan-direction length of the substrate on the stage includes measuring distances between marks provided on four corners of the substrate, thereby confirming the scan-direction length of the substrate.

According to example embodiments, the adjustment of the interval of the drive pulse signal to be applied to the spatial light modulation unit according to the scan-direction length of the substrate includes increasing the drive pulse signal interval upon confirming that the scan-direction length of the substrate is increased.

According to example embodiments, the adjustment of the interval of the drive pulse signal to be applied to the spatial light modulation unit according to the scan-direction length of the substrate includes decreasing the drive pulse signal interval upon confirming that the scan-direction length of the substrate is reduced.

According to example embodiments, the control method further includes confirming whether a measure is adjusted by applying a scale factor to the scan-direction length of the substrate; and correcting the drive pulse signal interval upon confirming that the scale factor is applied to the scan-direction length of the substrate, so as to perform an exposure operation corresponding to the scan-direction length of the substrate.

According to example embodiments, the drive pulse signal interval is increased if the scan-direction length of the substrate is increased via application of the scale factor, and is decreased if the scan-direction length of the substrate is reduced via application of the scale factor.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
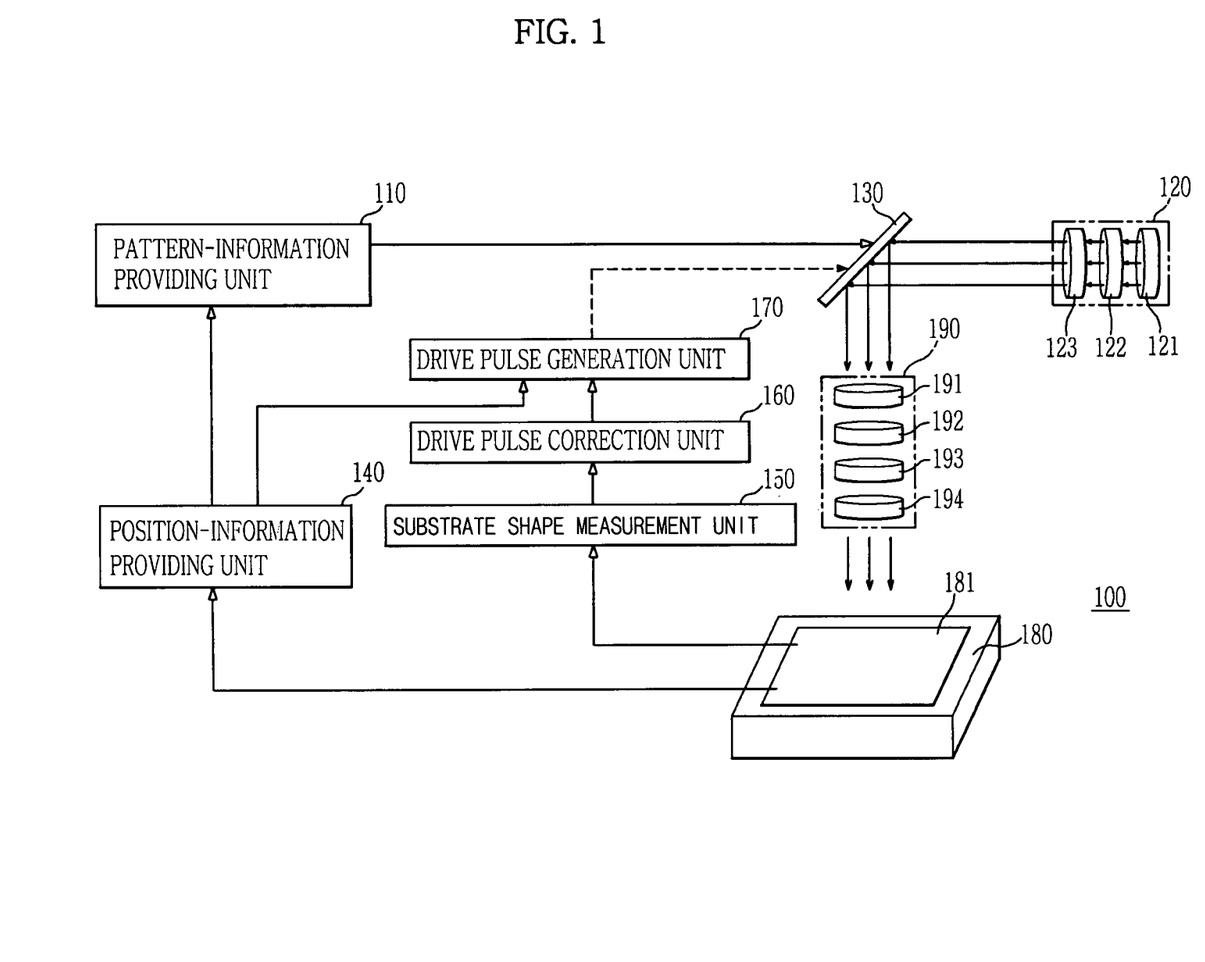
FIG. 1 is a diagrammatic configuration view of a mask-less exposure apparatus according to example embodiments.
Figure 2:
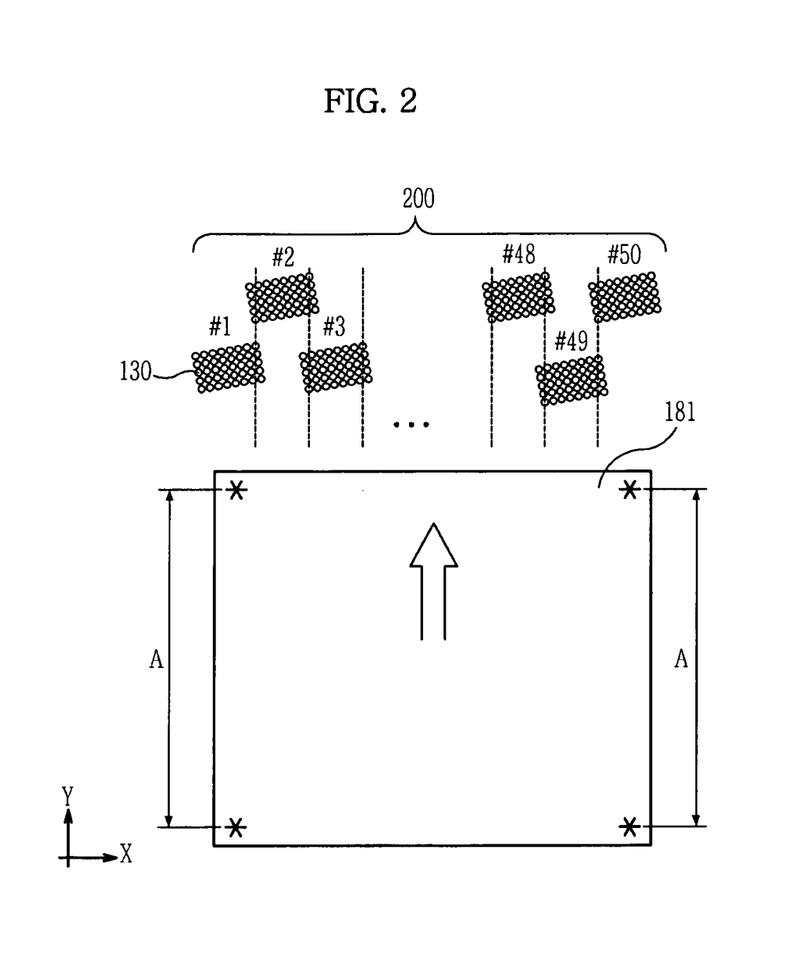
FIG. 2 is a view illustrating scanning exposure of a substrate by a mask-less exposure apparatus according to example embodiments.
Figure 3:
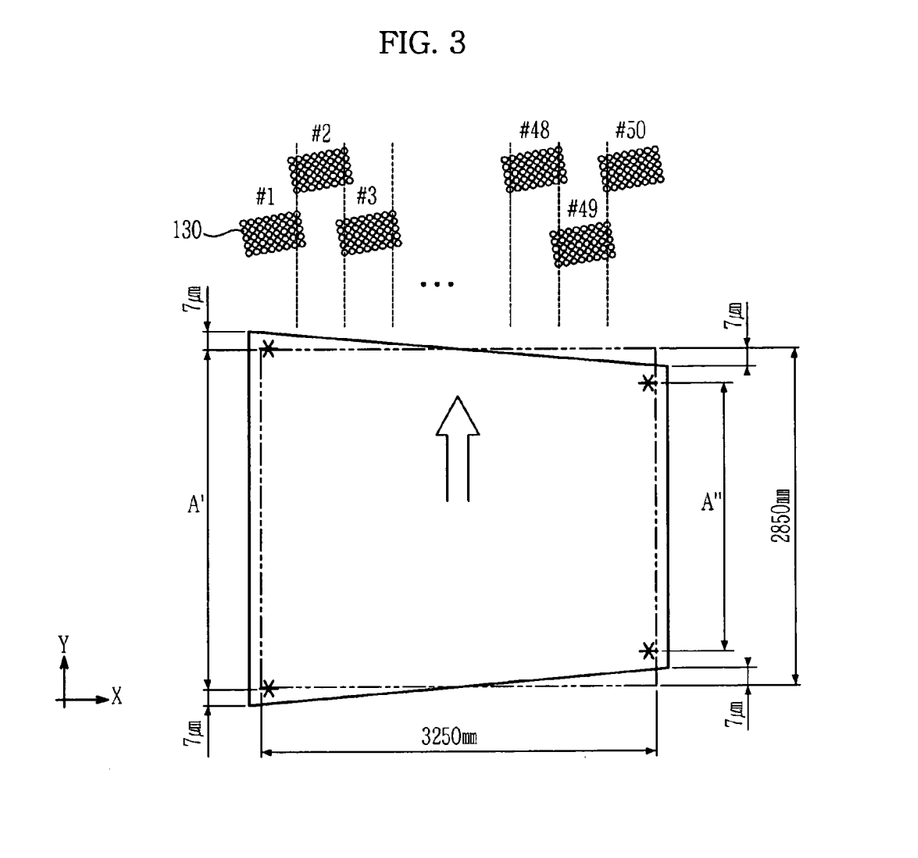
FIG. 3 is a view illustrating substrate length deformation in a scan direction caused upon scanning exposure by a mask-less exposure apparatus according to example embodiments.

FIG. 1 is a diagrammatic configuration view of a mask-less exposure apparatus according to example embodiments, FIG. 2 is a view illustrating scanning exposure of a substrate by a mask-less exposure apparatus according to example embodiments, and FIG. 3 is a view illustrating substrate length deformation in a scan direction caused upon scanning exposure by a mask-less exposure apparatus according to example embodiments.

Figure 4:
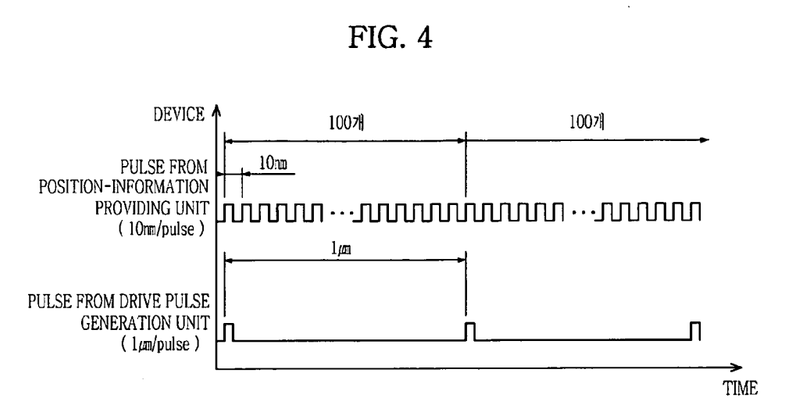
FIG. 4 is a view illustrating generation of drive pulse signals from a drive pulse generation unit depending on the interval of pulse signals from a position-information providing unit according to example embodiments.
Figure 5:
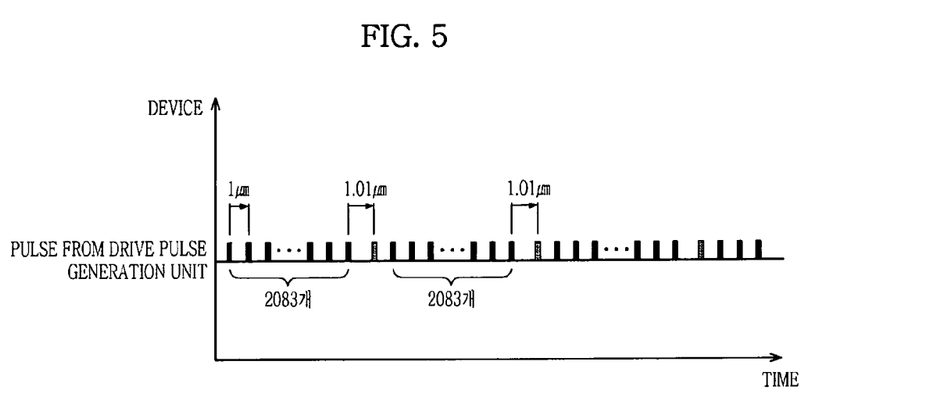
FIG. 5 is a view illustrating an increase in the interval of a drive pulse signal generated from a drive pulse generation unit according to example embodiments.
Figure 6:
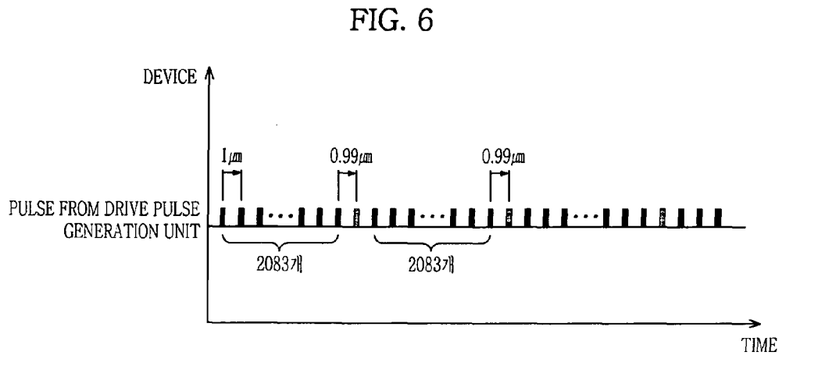
FIG. 6 is a view illustrating a decrease in the interval of a drive pulse signal generated from a drive pulse generation unit according to example embodiments.
Figure 7:
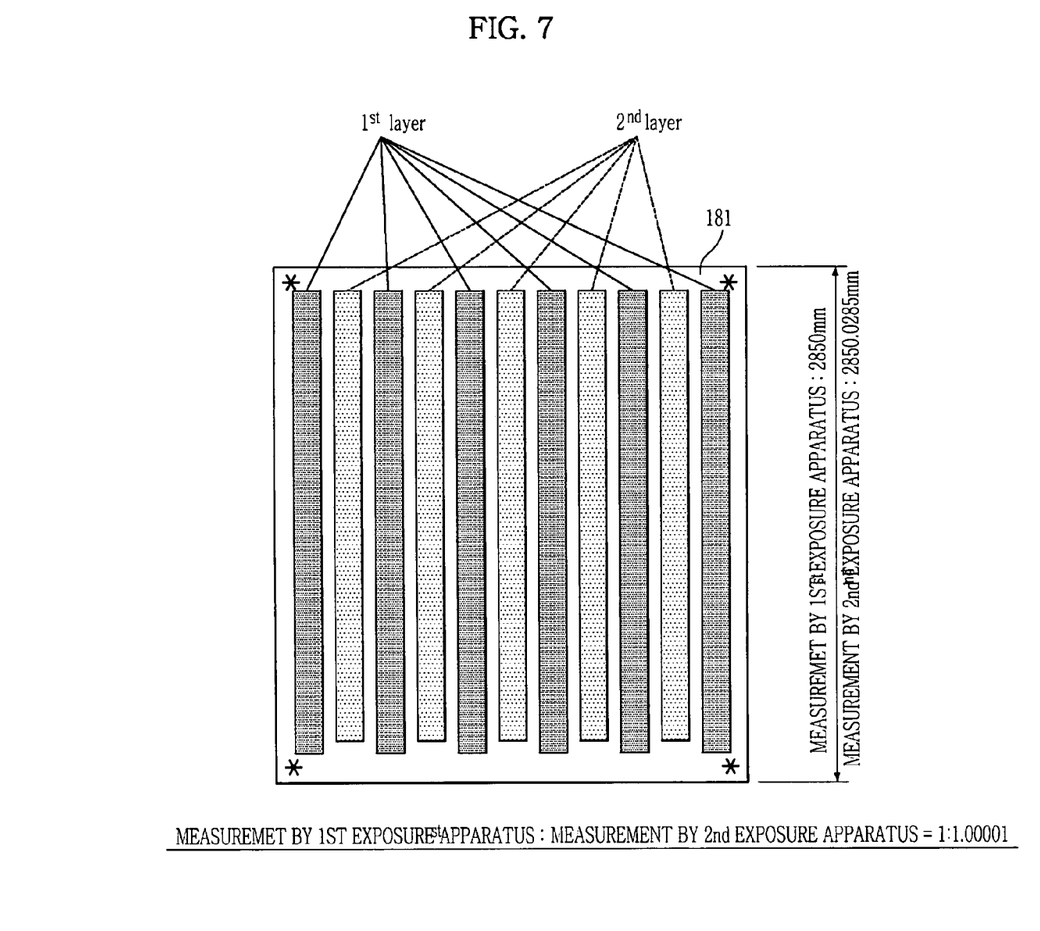
FIG. 7 is a view illustrating a difference between a substrate length measured from a first exposure apparatus and a substrate length measured from a second exposure apparatus when the two exposure apparatuses perform multi-layer exposure according to example embodiments.

FIG. 4 is a view illustrating generation of drive pulse signals from a drive pulse generation unit depending on the interval of pulse signals from a position-information providing unit according to example embodiments, FIG. 5 is a view illustrating an increase in the interval of a drive pulse signal generated from a drive pulse generation unit according to example embodiments, FIG. 6 is a view illustrating a decrease in the interval of a drive pulse signal generated from a drive pulse generation unit according to example embodiments, and FIG. 7 is a view illustrating a difference between a substrate length measured from a first exposure apparatus and a substrate length measured from a second exposure apparatus when the two exposure apparatuses perform multi-layer exposure according to example embodiments.

As shown in FIG. 1, the mask-less exposure apparatus 100 includes a pattern-information providing unit 110, a light source unit 120, a spatial light modulation unit 130, a position-information providing unit 140, a substrate shape measurement unit 150, a drive pulse correction unit 160, a drive pulse generation unit 170, a stage 180, and a light projection unit 190.

The pattern-information providing unit 110 receives information related to a pattern to be formed on a substrate 181 from a user, the information containing drawings in Computer Aided Design (CAD) files. The pattern-information providing unit 110 provides the pattern information to the spatial light modulation unit 130. The user initially inputs information, which indicates a time interval to generate an input signal regarding movement of the substrate 181, into the position-information providing unit 140, so that the pattern-information providing unit 110 prepares the pattern information to be transmitted to the spatial light modulation unit 130 on a per input time interval basis.

If the position-information providing unit 140 transmits an input signal indicating a position of the substrate 181 seated on the stage 180 to the pattern-information providing unit 110, the pattern-information providing unit 110 transmits the pattern information to the spatial light modulation unit 130 by being synchronized with the input signal.

The light source unit 120 includes a light source 121 to supply light, and a fly-eye lens 122 and a condenser lens 123 to collimate incident light from the light source 121. The fly-eye lens 122 serves to form a secondary image on the spatial light modulation unit 130 by use of the incident light from the light source 121. The condenser lens 123 serves to reduce light loss during formation of the secondary image, achieving uniform brightness of light to be transmitted to the spatial light modulation unit 130. With use of the fly-eye lens 122 and the condenser lens 123, even an extremely low intensity of incident light from the light source 121 may be converted into a sufficient magnitude of light to be projected to the spatial light modulation unit 130.

The spatial light modulation unit 130 may be formed of a Digital Micro Mirror (DMD). A plurality of micro-mirrors of the DMD are initially kept at an angle of zero degrees, but are tilted by a predetermined/desired angle in response to an input signal so as to guide a part of incident light in a desired angular direction while guiding the remaining incident light in a different angular direction, thereby selectively transmitting only a required quantity of light. That is, the spatial light modulation unit 130 operates the DMD according to the pattern information input from the pattern-information providing unit 110, thus acting to selectively transmit the incident light from the light source 121 to the substrate 181. As shown in FIG. 2, a plurality of spatial light modulation units 130, i.e. a plurality of DMDs or Liquid Crystal Displays (LCDs) may constitute a spatial light modulation unit array 200, to perform a scanning exposure operation throughout the substrate 181 having a large area. The scanning exposure operation is performed as light reflected from the spatial light modulation unit array 200 is moved relative to the substrate 181 throughout a surface of the substrate 181. Practically, the substrate 181 is moved at a predetermined/desired velocity so that light scans the overall surface of the substrate 181.

The position-information providing unit 140 monitors movement of the stage 180 and generates an input signal indicating a position of the substrate 181 as the substrate 181 is moved along with the stage 180. The position-information providing unit 140 may include a linear encoder and/or a laser interferometer. The input signal may be a pulse signal and a sinusoidal signal and is generated by a predetermined/desired time interval during movement of the substrate 181. According to example embodiments, a pair of position-information providing units 140 is installed at left and right sides of a substrate seating position, so as to generate an input signal indicating left and right position information of the substrate.

The substrate shape measurement unit 150 may include two cameras, and may measure the scan-direction length of the substrate 181 by confirming distances between marks provided at corners of the substrate 181. For example, the scan-direction length of the substrate 181 may be measured by measuring a distance A' between left upper and lower marks of the substrate 181 and a distance A" between right upper and lower marks of the substrate 181 shown in FIG. 2.

The drive pulse correction unit 160 adjusts a drive pulse signal interval according to the deformed status of the substrate 181 measured by the substrate shape measurement unit 150. As shown in FIG. 3, the drive pulse correction unit 160 adjusts the drive pulse signal interval so as to correspond to the deformed substrate upon confirming that the substrate is deformed into a parallelogram, for example. If identical drive pulse signals are applied to the plurality of spatial light modulation units 130 despite deformation of the substrate, this causes a rectangular exposure area different from an exposure pattern created before deformation of the substrate. The drive pulse correction unit 160 adjusts the interval of a drive pulse signal to be applied to each of the plurality of spatial light modulation units 130 based on the following Eq. 1.

$$\text{New\_}\Delta PEG(n) = \Delta PEG \ast \{(A - B/C \ast (n - (C + 0.5))\}/A \qquad \text{Eq. 1}$$

Here, "New_ΔPEG(n)" is a corrected drive pulse signal interval, "n" is the enumeration order of the corresponding spatial light modulation unit, "ΔPEG" is a fixed drive pulse signal interval before correction, "A" is the scan-direction length of the substrate, "B" is the deformed length of the substrate, and "C" is half the number of the spatial light modulation units. In the meantime, PEG denotes a Position Event Generator.

Referring to FIG. 3, ΔPEG is 1 μm (this is a preset value), A is 2,850,000 μm, B is 14 μm, and C is 25.

In one example, the corrected drive pulse signal interval of a first spatial light modulation unit (n=1) is calculated as about 1.0000048 μm using the above Eq. 1. Specifically, to perform an exposure operation suitable for an enlarged substrate, the drive pulse signal interval of the first spatial light modulation unit 130 may be changed so as to increase from the preset value of about 1 μm to the corrected value of about 1.0000048 μm. In the meantime, the position-information providing unit 140, such as a linear encoder or a laser interferometer, generates pulse signals according to the position information of the stage 180. The position information is generated by a predetermined/desired time interval during operation of the substrate 181. Referring to FIG. 4, assuming that the interval of a drive pulse signal generated from the drive pulse generation unit 170 is about 1 μm and the interval of a pulse signal generated from the position-information providing unit 140 is about 10 nm, the drive pulse generation unit 170 generates 1 pulse signal when the position-information providing unit 140 generates 100 pulse signals. However, since the position-information providing unit 140, such as a linear encoder or laser interferometer, has a limited resolution, it may be impossible to realize a difference of the corrected pulse signal interval (0.0000048 μm=1.0000048−1). For example, if the resolution of the position information providing unit 140 is about 10 nm, a difference of about 10 nm is caused only after 2083 pulse signals (10 nm/0.0048 nm). Accordingly, it may be required to successively generate drive pulse signals per the interval of about 1.0000048 μm. Accordingly, to enlarge an exposure area in a scan direction, it may be necessary to correct the pulse signal interval after generation of the calculated number of pulse signals (e.g., 2083 pulse signals in the above described example). Referring to FIG. 5, when the drive pulse generation unit 170 generates about 2083 drive pulse signals, cumulative error is about 10 nm. Therefore, the drive pulse generation unit 170 is controlled to generate a 2084$^{th}$ drive pulse signal when the position-information providing unit 140 generates 101 pulse signals, so that the interval of the 2084$^{th}$ drive pulse signal is about 1.01 μm and the cumulative error of 10 nm may be almost eliminated. Then, until 2083 drive pulse signals are generated starting from a 2085$^{th}$ drive pulse signal, the drive pulse generation unit 170 is controlled to generate a drive pulse signal once whenever the position-information providing unit 140 generates 100 pulse signals. In the meantime, referring to FIG. 3, although the increased length of the substrate at the left edge of the first spatial light modulation unit 130 is about 14 μm, the increased length of the substrate at the center of the first spatial light modulation unit 130 is about 13.86 μm (=14 μm*49.5/50). Accordingly, an enlarged exposure area may be realized when a drive pulse signal, which is generated whenever the position-information providing unit 140 generates 101 pulses, is generated around 1386 times (13.86 μm/10 nm).

In example embodiments, the corrected drive pulse signal interval of a fiftieth spatial light modulation unit (n=50) is calculated as around 0.999995186 μm using the above Eq. 1. Specifically, to perform an exposure operation suitable for a reduced substrate, the drive pulse signal interval of the fiftieth spatial light modulation unit 130 may be changed so as to reduce from the preset value of 1 μm to the corrected value of around 0.999995186 μm. In the meantime, since the position-information providing unit 140 has a limited resolution as described above, it may be required to realize a difference of the corrected pulse signal interval (0.000004814=1−0.999995186). Accordingly, it may be required to successively generate drive pulse signals per the interval of about 0.999995186 μm. Accordingly, to reduce an exposure area in a scan direction, it may be necessary to correct the drive pulse signal interval after generation of the calculated number of drive pulse signals (in the above described example, 0.0000048 μm*x=10 nm, x=2083). Referring to FIG. 5, when the drive pulse generation unit 170 generates 2083 drive pulse signals, cumulative error is about 10 nm. Therefore, the drive pulse generation unit 170 is controlled to generate a 2084$^{th}$ drive pulse signal when the position-information providing unit 140 generates 99 pulses. More specifically, the interval of the 2084$^{th}$ drive pulse signal is 0.99 μm and the cumulative error of 10 nm may be reduced and/or eliminated. Then, until 2083 drive pulse signals are generated starting from a 2085$^{th}$ drive pulse signal, the drive pulse generation unit 170 is controlled to generate a drive pulse signal once whenever the position information providing unit 140 generates 100 pulse signals. In the meantime, referring to FIG. 3, although the decreased length of the substrate at the right edge of the fiftieth spatial light modulation unit 130 is 14 μm, the decreased length of the substrate at the center of the fiftieth spatial light modulation unit 130 is around 13.86 μm (=14 μm*49.5/50). Accordingly, an exposure area may be reduced by around 13.86 μm when a drive pulse signal, which is generated whenever the position-information providing unit 140 generates 99 pulse signals, is generated 1386 times (13.86 μm/10 nm).

When a measure is adjusted by applying scale factors to, for example, sensors of the position-information providing unit 140 and the substrate shape measurement unit 150 mounted in the exposure apparatus 100, the drive pulse correction unit 160 may adjust the drive pulse signal interval, enabling an accurate exposure operation corresponding to the length of the substrate. Referring to FIG. 7, when two exposure apparatuses perform multi-layer exposure, the length of the substrate measured from the first exposure apparatus is 2850 mm, and the length of the substrate measured by the second exposure apparatus about 2850.0285 mm. In this case, it may be necessary for the second exposure apparatus to adjust a measure by applying a scale factor of 1/1.00001. In the case of the drive pulse generation unit 170, it may be required to successively adjust the drive pulse signal interval due to the small scale factor of 1/1.00001 and therefore, the drive pulse signal interval may be adjusted in the same manner as the above description, to prevent accumulation of drive pulse signal interval error upon application of the scale factor. For example, if the interval of the drive pulse signal generated from the drive pulse generation unit 170 is 1 μm and the interval of the pulse signal generated from the position-information providing unit 140 is 10 nm, the drive pulse generation unit 170 generates 1 pulse when the position-information providing unit 140 generates 100 pulses. In this case, if the scale factor of 1/1.000001 is applied to the position-information providing unit 140, the interval of the pulse signal generated from the position-information providing unit 140 is 10 nm*(1/1.000001), and the drive pulse generation unit 170 generates 1 drive pulse signal whenever the position-information providing unit 140 generates 100.001 pulse signals (1 μm/(10 nm*1/1.00001)). Since the integer value of 100.001 is 100 and the decimal value of 0.001 has no effect upon generation of successive drive pulse signals, there is no effect due to application of the scale factor. Accordingly, since the position-information providing unit 140 generates 100.001*1000=100001 pulses (cumulative error is "1") when 1000 drive pulse signals are generated, the drive pulse generation unit 170 generates a 1001$^{st}$ drive pulse signal when the position-information providing unit 140 generates 101 pulses, enabling elimination of the cumulative error.

The drive pulse generation unit 170 serves to generate a plurality of drive pulse signals equal to the number of the spatial light modulation units 130 upon receiving the input signal from the position-information providing unit 140, and to distribute and transmit the plurality of drive pulse signals to the respective spatial light modulation units 130 in a one to one ratio. The drive pulse signals transmitted to the respective spatial light modulation units 130 are used to control an operation beginning time of each spatial light modulation unit 130. The drive pulse signal generation unit 170 generates the drive pulse signals according to the drive pulse signal interval adjusted by the drive pulse correction unit 160.

The stage 180 is configured to support the substrate 181 seated thereon. The substrate 181 includes all objects on which a predetermined/desired pattern will be formed, such as a panel, wafer, etc. The stage 180 may be moved in a direction parallel to an upper surface thereof, so that light emerging from the spatial light modulation unit 130 scans the surface of the substrate 181 from one side to the other side of the substrate 181.

The light projection unit 190 is installed above the upper surface of the substrate 181 and serves to condense light selectively transmitted from the spatial light modulation unit 130 so as to project the condensed light on the substrate 181. The light projection unit 190 may include a Total Internal Reflection (TIR) member 191, a light extender 192, a Micro Lens Array (MLA) 193, and a projection lens 194. The TIR member 191 reduces loss of light transmitted from the spatial light modulation unit 130 via total internal reflection and transmits the light to the light extender 192. The light extender 192 extends the light to the size of the substrate 181 on which a pattern will be formed, and the MLA 193 integrates the light to a predetermined/desired size. When the MLA 193 is located above the upper surface of the substrate 181, the MLA 193 may exhibit deterioration in light transmittance due to fumes, etc. emerging from a pattern material. To prevent this deterioration in light transmittance, the projection lens 194 is installed between the MLA 193 and the substrate 181.

Figure 8:
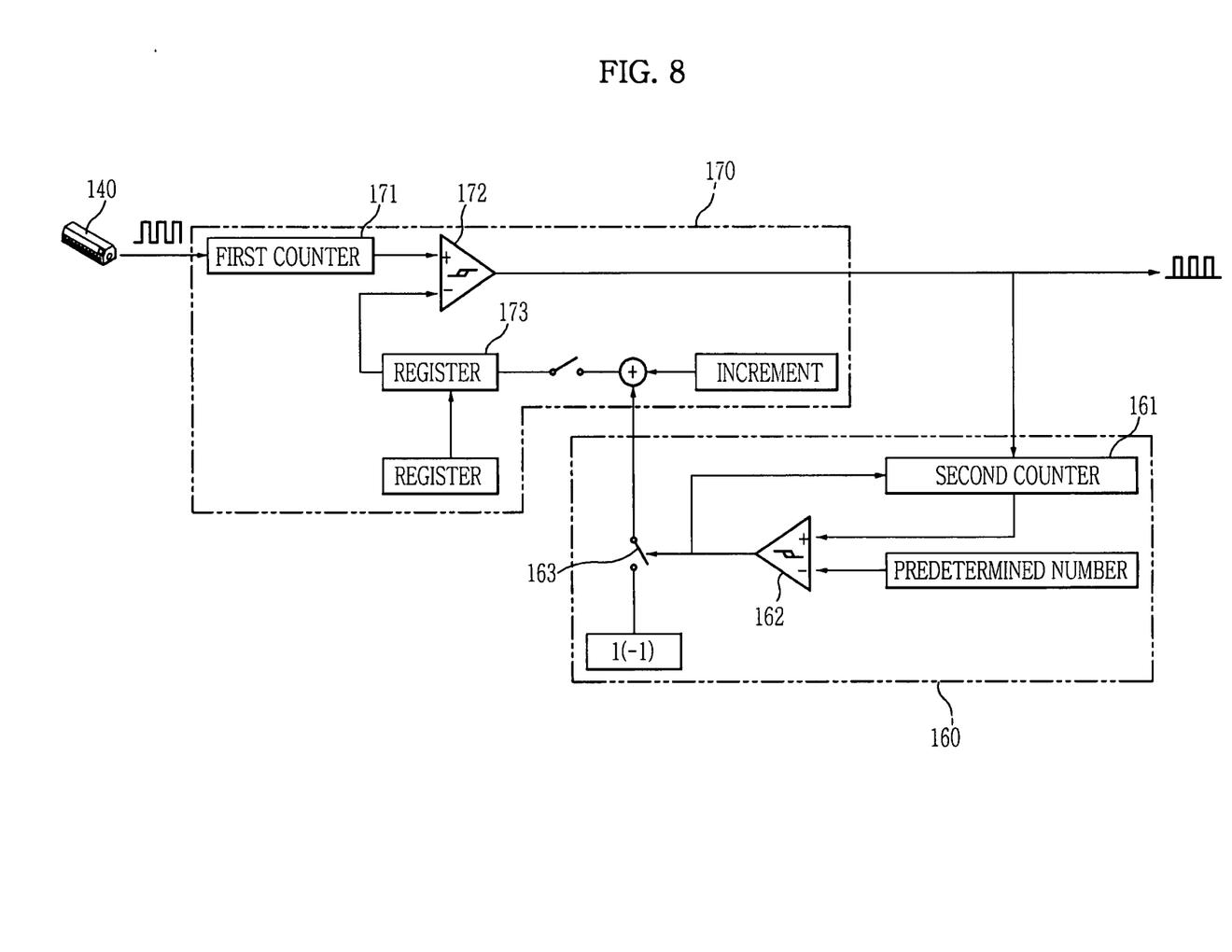
FIG. 8 is a control block diagram to enlarge or reduce an exposure pattern by an exposure apparatus according to example embodiments.

FIG. 8 is a control block diagram to enlarge or reduce an exposure pattern by the exposure apparatus according to example embodiments.

As shown in FIG. 8, the position-information providing unit 140, which monitors movement of the stage 180, transmits an input signal indicating a position of the substrate 181 to the drive pulse generation unit 170.

The drive pulse generation unit 170 includes a first counter 171 to receive position data of the stage 180 from the position-information providing unit 140, a register 173 to store initial position data and an increment of the drive pulse interval, and a first comparator 172 to compare the position data of the stage 180 transmitted through the first counter 171 with the position data stored in the register 173 so as to periodically generate drive pulse signals at a predetermined/desired position in a scan direction of the stage 180 until the stage 180 having passed through an initial position reaches a final position.

The drive pulse correction unit 160 includes a second counter 161 to count the number of drive pulse signals generated from the first comparator 172, a second comparator 162 to compare the number of drive pulse signals counted by the second counter 161 with a predetermined/desired number, and an update part 163 to increase or decrease a pulse increment by '1' if the number of drive pulses counted by the second counter 161 is equal to the predetermined/desired number. The increase or decrease magnitude of the pulse increment is not limited to the above mentioned '1', and may be determined in various ways as per design requirements.

The above mentioned predetermined/desired number denotes a reference number to increase or decrease the drive pulse signal interval. In one example, when the resolution of the position-information providing unit 140 is 10 nm, the predetermined/desired number in FIG. 3 is 2083, and the predetermined/desired number in FIG. 7 is 1000.

Figure 9:
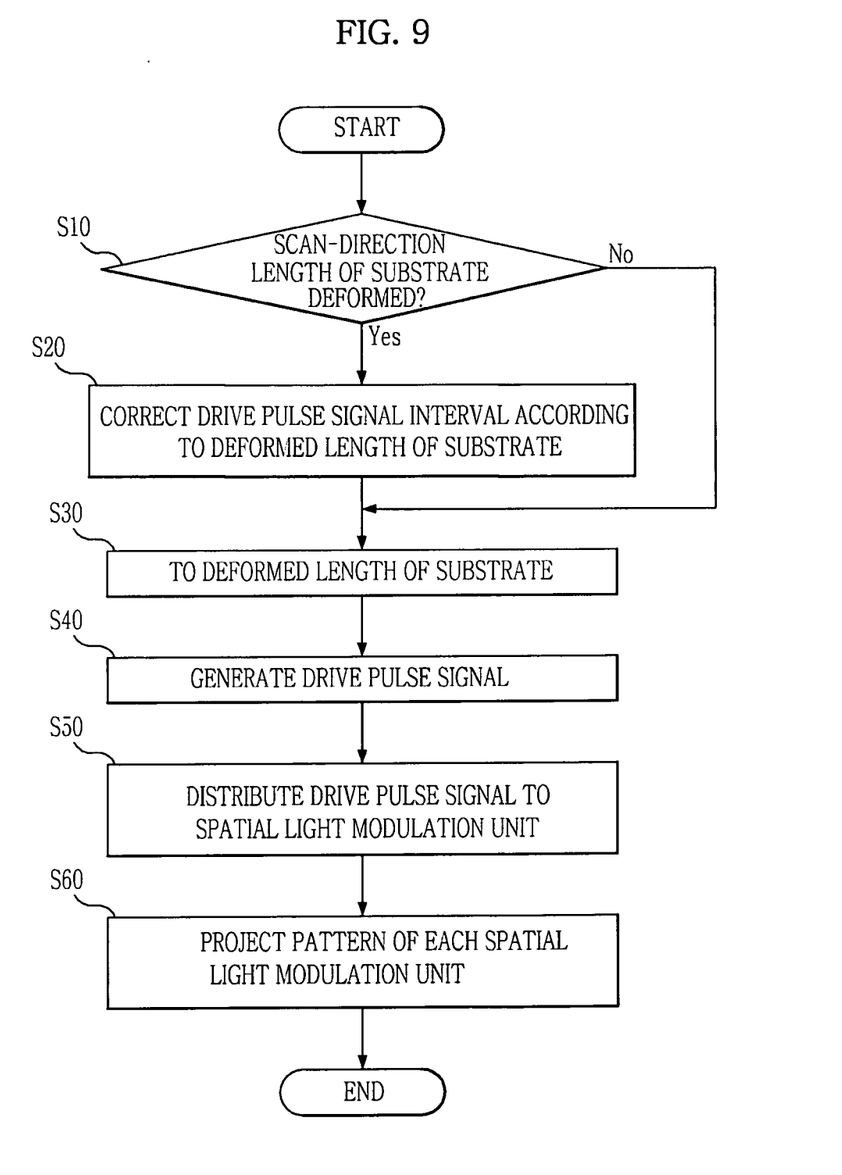
FIG. 9 is a control flow chart of an exposure apparatus according to example embodiments.

FIG. 9 is a control flow chart of the exposure apparatus according to example embodiments.

As shown in FIG. 9, once operation of the exposure apparatus begins, the substrate shape measurement unit 150 measures whether or not the scan-direction length of the substrate 181 mounted on the stage 180 is deformed. The substrate shape measurement unit 150 may include two cameras, and may measure the deformed status of the substrate 181 by confirming distances between the marks provided at the corners of the substrate 181 (S10).

Next, if it is confirmed, as a result of the substrate shape measurement unit 150 confirming the distances between the marks on the corners of the substrate 181, that the scan-direction length of the substrate 181 is deformed, the drive pulse correction unit 160 adjusts the drive pulse signal interval according to the deformed length of the substrate. In the meantime, referring to FIG. 3, the scan-direction length of the left side of the substrate 181 is designated by A' and the scan-direction length of the right side of the substrate 181 is designated by A". As will be appreciated from FIG. 3, the deformation of the substrate 181 may be confirmed from a difference between the scan-direction lengths of the left and right sides of the substrate 181. The drive pulse correction unit 160 corrects the interval of the drive pulse signal to be applied to each of the plurality of spatial light modulation units 130 using the following Eq. 1 (S20).

$$\text{New\_}\Delta\text{PEG}(n)=\Delta\text{PEG}*\{(A-B/C*(n-(C+0.5))\}/A \qquad \text{Eq. 1}$$

Here, "New_ΔPEG(n)" is a corrected drive pulse signal interval, "n" is the order of the corresponding spatial light modulation unit, "ΔPEG" is a fixed drive pulse signal interval before correction, "A" is the scan-direction length of the substrate, "B" is the deformed length of the substrate, and "C" is half the number of the spatial light modulation units. In the meantime, PEG denotes a Position Event Generator.

Next, the position-information providing unit 140 monitors movement of the stage 180 and generates an input signal indicating a position of the substrate 181 as the substrate 181 is moved along with the stage 180. The input signal may be a pulse signal and/or a sinusoidal signal, and is generated by a predetermined/desired interval during movement of the substrate 181 (S30).

Next, the drive pulse generation unit 170 generates drive pulse signals according to information related to the pulse signal interval corrected by the drive pulse correction unit 160 and the input signal transmitted from the position-information providing unit 140 (S40).

Next, the drive pulse signals generated from the drive pulse generation unit 170 are transmitted to the respective spatial light modulation units 130, so as to control an operation beginning time of each spatial light modulation unit 130 (S50).

Next, the spatial light modulation unit 130 is switched according to a synchronizing signal transmitted from the drive pulse generation unit 170, so as to project a pattern on the substrate 181 (S60).

If it is confirmed in operation S10 that the scan-direction length of the substrate is not deformed, operation S30 is performed without adjustment of the drive pulse signal interval.

Figure 10:
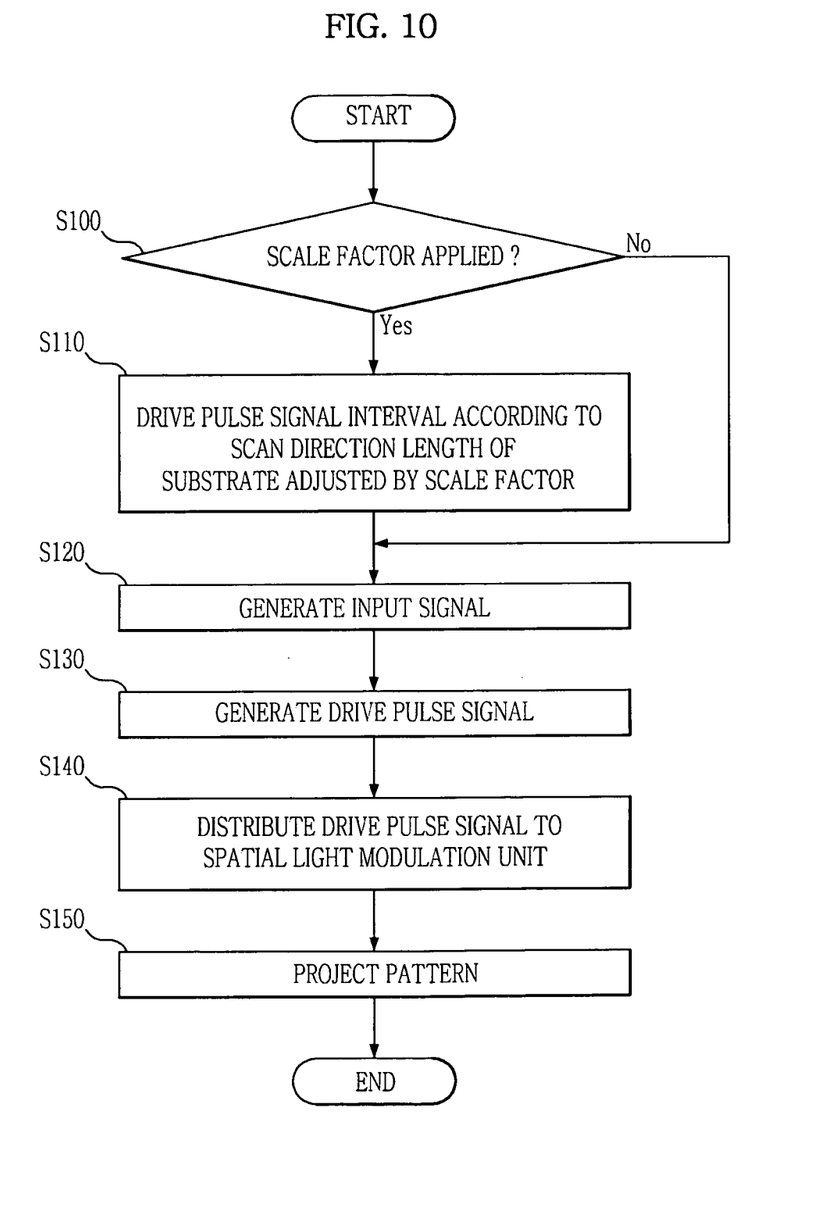
FIG. 10 is a control flow chart of an exposure apparatus according to example embodiments.

FIG. 10 is a control flow chart of the exposure apparatus according to example embodiments.

As shown in FIG. 10, the drive pulse correction unit 160 confirms whether or not a measure is adjusted by applying scale factors to, for example, sensors of the position-information providing unit 140 and the substrate shape measurement unit 150 mounted in the exposure apparatus 100 and if the adjustment of the measure is confirmed, the drive pulse correction unit 160 corrects the drive pulse signal interval, enabling an accurate exposure operation corresponding to the length of the substrate (S100 and S110).

Next, the position-information providing unit 140 monitors movement of the stage 180 and generates an input signal indicating a position of the substrate 181 as the substrate 181 is moved along with the stage 180. The input signal may be a pulse signal and/or a sinusoidal signal, and is generated by a predetermined/desired interval during movement of the substrate 181 (S120).

Next, the drive pulse generation unit 170 generates drive pulse signals according to information related to the pulse signal interval corrected by the drive pulse correction unit 160 and the input signal transmitted from the position-information providing unit 140 (S130).

Next, the drive pulse signals generated from the drive pulse generation unit 170 are transmitted to the respective spatial light modulation units 130, so as to control an operation beginning time of each spatial light modulation unit 130 (S140).

Next, the spatial light modulation unit 130 is switched according to a synchronizing signal transmitted from the drive pulse generation unit 170, so as to project a pattern onto the substrate 181 (S150).

In the meantime, if it is confirmed in operation S100 that no scale factor is applied to the exposure apparatus, operation S120 is performed without adjustment of the drive pulse signal interval.

As apparent from the above description, a mask-less exposure apparatus according to example embodiments may enlarge or reduce an exposure area in a scan direction of a substrate. Accordingly, it may be possible to prevent exposure of a pattern having a size different from a target exposure pattern size in the scan direction of the substrate.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A mask-less exposure apparatus comprising:
   a light source unit configured to supply light;
   a spatial light modulation unit configured to selectively transmit the light to a substrate;
   a drive pulse generation unit configured to generate a drive pulse signal and adjust an operation beginning time of the spatial light modulation unit;
   a substrate shape measurement unit configured to measure a scan-direction length of the substrate; and
   a drive pulse correction unit configured to at least one of increase and decrease a drive pulse signal interval so as to enlarge or reduce an exposure area of the substrate according to the scan-direction length of the substrate.

2. The mask-less exposure apparatus according to claim 1, further comprising:
   a position-information providing unit configured to generate an input signal having a desired period in response to a movement of the substrate in a scan direction.

3. The mask-less exposure apparatus according to claim 2, wherein the input signal includes a pulse signal, and
   the drive pulse generation unit generates the drive pulse signal whenever a reference number of the pulse signal is generated.

4. The mask-less exposure apparatus according to claim 3, wherein the drive pulse correction unit is configured to correct the drive pulse signal interval by changing the reference number of the pulse signal.

5. The mask-less exposure apparatus according to claim 4, wherein the drive pulse correction unit is configured to increase the reference number to increase the drive pulse signal interval upon confirming that the scan-direction length of the substrate is increased.

6. The mask-less exposure apparatus according to claim 4, wherein the drive pulse correction unit is configured to decrease the reference number to decrease the drive pulse signal interval by confirming that the scan-direction length of the substrate is reduced.

7. The mask-less exposure apparatus according to claim 1, wherein the spatial light modulation unit includes a Digital Micro Mirror (DMD), and a plurality of spatial light modulation units are provided to perform an exposure operation on the substrate.

8. The mask-less exposure apparatus according to claim 1, wherein the drive pulse correction unit is configured to,
   confirm whether or not a measure is adjusted by applying a scale factor to the scan-direction length of the substrate, and
   if the scale factor is applied to the scan-direction length of the substrate, corrects the drive pulse signal interval to perform an exposure operation corresponding to the scan-direction length of the substrate.

9. The mask-less exposure apparatus according to claim 1, wherein the substrate shape measurement unit is configured to measure the scan-direction length of the substrate by comparing distances between marks provided on four corners of the substrate.

10. A control method of a mask-less exposure apparatus comprising:
    confirming a scan-direction length of a substrate on a stage;
    at least one of increasing and decreasing an interval of a drive pulse signal applied to a spatial light modulation unit according to the scan-direction length of the substrate; and
    applying the drive pulse signal of the adjusted interval to the spatial light modulation unit, so as to expose an increased or decreased substrate area according to the scan-direction length of the substrate.

11. The control method according to claim 10, wherein the confirming the scan-direction length of the substrate on the stage comprises:
    measuring distances between marks provided on four corners of the substrate, thereby confirming the scan-direction length of the substrate.

12. The control method according to claim 10, wherein the adjusting the interval of the drive pulse signal to be applied to the spatial light modulation unit according to the scan-direction length of the substrate comprises:
    increasing the drive pulse signal interval upon confirming that the scan-direction length of the substrate is increased.

13. The control method according to claim 10, wherein the adjusting the interval of the drive pulse signal to be applied to the spatial light modulation unit according to the scan-direction length of the substrate comprises:
    decreasing the drive pulse signal interval upon confirming that the scan-direction length of the substrate is reduced.

14. The control method according to claim 10, further comprising:
    confirming whether a measure is adjusted by applying a scale factor to the scan-direction length of the substrate; and
    correcting the drive pulse signal interval upon confirming that the scale factor is applied to the scan-direction length of the substrate, so as to perform an exposure operation corresponding to the scan-direction length of the substrate.

15. The control method according to claim 14, wherein the drive pulse signal interval is increased if the scan-direction length of the substrate is increased as a result of applying the scale factor, and is decreased if the scan-direction length of the substrate is reduced as the result of applying the scale factor.

* * * * *